(12) United States Patent
Floyd

(10) Patent No.: US 7,790,229 B2
(45) Date of Patent: Sep. 7, 2010

(54) HIGH RESOLUTION SUBSTRATE HOLDER LEVELING DEVICE AND METHOD

(75) Inventor: Kirby Floyd, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/252,277

(22) Filed: Oct. 15, 2008

(65) Prior Publication Data

US 2009/0031957 A1 Feb. 5, 2009

Related U.S. Application Data

(62) Division of application No. 11/118,254, filed on Apr. 29, 2005, now Pat. No. 7,572,340.

(60) Provisional application No. 60/631,922, filed on Nov. 29, 2004.

(51) Int. Cl.
*A23G 3/24* (2006.01)
*B05C 3/00* (2006.01)
*C23C 16/00* (2006.01)

(52) U.S. Cl. .................. 427/248.1; 248/188.4; 33/813; 33/814; 33/822; 74/89.45

(58) Field of Classification Search ......... 118/715–730, 118/664–665; 33/501, 813–814, 822; 156/345.1
See application file for complete search history.

(56) References Cited

U.S. PATENT DOCUMENTS

| 3,758,175 A | * | 9/1973 | Van Roojen | ............... | 384/12 |
| 3,913,380 A | * | 10/1975 | Jones et al. | ............... | 73/35.02 |
| 4,878,787 A | * | 11/1989 | Hunt | ............... | 408/181 |
| 5,399,387 A | | 3/1995 | Law et al. | | |
| 5,543,890 A | | 8/1996 | Tanaka et al. | | |

(Continued)

FOREIGN PATENT DOCUMENTS

EP 1 041 171 A1 10/2000

OTHER PUBLICATIONS

Final Office Action dated Dec. 30, 2008 for U.S. Appl. No. 11/118,254; pp. 8.

(Continued)

*Primary Examiner*—Michael Cleveland
*Assistant Examiner*—Nathan K Ford
(74) *Attorney, Agent, or Firm*—Townsend and Townsend and Crew

(57) ABSTRACT

A method for adjusting a spacing of a leveling plate from a chamber body comprises attaching a mounting stud that includes a stud threaded surface to the chamber body. An adjustment screw is provided that has a first threaded surface threadingly engaged with the stud threaded surface. A bushing is provided that has a bushing threaded surface threadingly engaged with a second threaded surface of the adjustment screw. The bushing is movably coupled to the leveling plate. Coarse adjustment of the spacing between the leveling plate and the chamber body is made by rotating the adjustment screw with respect to the mounting stud. The bushing is fixed to the leveling plate. Fine adjustment of the spacing between the leveling plate and the chamber body is made by rotating the adjustment screw with respect to the mounting stud and the bushing.

15 Claims, 13 Drawing Sheets

U.S. PATENT DOCUMENTS

| | | | |
|---|---|---|---|
| 5,558,717 A * | 9/1996 | Zhao et al. | 118/715 |
| 5,769,113 A * | 6/1998 | Alberts et al. | 137/454.6 |
| 5,792,269 A | 8/1998 | Deacon et al. | |
| 5,861,197 A | 1/1999 | Law et al. | |
| 6,090,714 A | 7/2000 | Jang et al. | |
| 6,106,625 A | 8/2000 | Koai et al. | |
| 6,149,365 A | 11/2000 | White et al. | |
| 6,149,987 A | 11/2000 | Perng et al. | |
| 6,206,972 B1 | 3/2001 | Dunham | |
| 6,245,192 B1 | 6/2001 | Dhindsa et al. | |
| 6,294,025 B1 | 9/2001 | Kinder | |
| 7,229,237 B1 * | 6/2007 | Fulgham | 408/115 R |
| 7,413,612 B2 | 8/2008 | Floyd et al. | |
| 2008/0223873 A1 | 9/2008 | Chen et al. | |
| 2008/0286444 A1 | 11/2008 | Floyd et al. | |
| 2009/0269512 A1 | 10/2009 | Zhou et al. | |

OTHER PUBLICATIONS

Non-Final Office Action dated Dec. 31, 2007 for U.S. Appl. No. 11/118,254; pp. 10.

PCT International Search Application Number PCT/US2005/042137; Report Mailed on Apr. 24, 2004; pp. 2.

Zuo et al. "An inverse-flow showerhead MOVPE reactor design" Journal of Crystal Growth, 2007, pp. 425-427, 298 published on 2006 by Elsevier B.V.

Notice of Allowance for U.S. Appl. No. 10/618,187 mailed on Jun. 13, 2008; 7 pages.

Advisory Action for U.S. Appl. No. 10/618,187 mailed on Feb. 12, 2008; 3 pages.

Final Office Action for U.S. Appl. No. 10/618,187 mailed on Oct. 1, 2007; 9 pages.

Final Office Action for U.S. Appl. No. 10/618,187 mailed on Mar. 22, 2007; 10 Pages.

Non-Final Office Action for U.S. Appl. No. 12/182,345 mailed on Nov. 27, 2009; 6 pages.

PCT International Search Application No. PCT/US2005/042137; mailed on Apr. 25, 2006; 2 pages.

Written Opinion for Application No. PCT/US2005/042173; mailed on Apr. 21, 2006; 5 pages.

* cited by examiner

HIGH RESOLUTION SUBSTRATE HOLDER LEVELING DEVICE AND METHOD

CROSS-REFERENCES TO RELATED APPLICATIONS

This application is a division of U.S. patent application Ser. No. 11/118,254, now U.S. Pat. No. 7,572,340 B2, filed on Apr. 29, 2005, which claims the benefit of U.S. Provisional Patent Application No. 60/631,922, filed Nov. 29, 2004. The entire disclosures of 11/118,254, now U.S. Pat. No. 7,572,340 B2, and 60/631,922 are incorporated herein by reference in their entirety for all purposes.

BACKGROUND OF THE INVENTION

The present invention relates generally to semiconductor manufacturing and, more particularly, to a method and an apparatus for achieving a desired thickness uniformity of a layer formed on a substrate.

One of the primary steps in the fabrication of modern semiconductor devices is the formation of a thin film on a semiconductor substrate by chemical reaction of gases. Such a deposition process is referred to as chemical vapor deposition (CVD). Conventional thermal CVD processes supply reactive gases to the substrate surface where heat-induced chemical reactions can take place to produce the desired film. Plasma enhanced CVD processes promote the excitation and/or dissociation of the reactant gases by the application of radio frequency (RF) energy to the reaction zone proximate the substrate surface thereby creating a plasma of highly reactive species. The high reactivity of the released species reduces the energy required for a chemical reaction to take place, and thus lowers the required temperature for such CVD processes.

The substrate rests on a substrate support during processing in the chamber such as the formation of a layer on the substrate. The substrate support typically is a substrate heater which supports and heats the substrate during substrate processing. The substrate rests above the heater surface of the heater and heat is supplied to the bottom of the substrate. Some substrate heaters are resistively heated, for example, by electrical heating elements such as resistive coils disposed below the heater surface or embedded in a plate having the heater surface. The heat from the substrate heater is the primary source of energy in thermally driven processes such as thermal CVD for depositing layers including undoped silicate glass (USG), doped silicate glass (e.g., borophosphosilicate glass (BPSG)), and the like.

The substrate support typically supports the substrate opposite a gas distribution faceplate through which a reactant gas is supplied to the chamber. The faceplate is part of the gas distribution member for supplying one or more gases to the chamber. The gas flow from the faceplate to the substrate affects the uniformity of the layer formed on the substrate, such as the thickness of the layer.

BRIEF SUMMARY OF THE INVENTION

Embodiments of the present invention are directed to adjusting the spacing between the substrate support and the faceplate of the gas distribution member to achieve improved uniformity of the layer formed on the substrate. The spacing between the substrate support and the faceplate affects the gas flow to the substrate surface and the uniformity of the layer formed on the substrate surface. The spacing between the substrate and the faceplate is typically about 0.2 inch. In some processes, the substrate is placed very close to the faceplate (e.g., spaced by about 0.1 inch or less) to increase film deposition rate. This decrease in spacing renders the film thickness uniformity more sensitive to the uniformity of spacing between the substrate and the faceplate.

In accordance with an embodiment of the present invention, a method for adjusting a spacing of a leveling plate from a chamber body comprises attaching a mounting stud to the chamber body. The mounting stud including a stud threaded surface. The method further comprises providing an adjustment screw having a first threaded surface threadingly engaged with the stud threaded surface of the mounting stud; providing a bushing having a bushing threaded surface threadingly engaged with a second threaded surface of the adjustment screw; movably coupling the bushing to the leveling plate; and making coarse adjustment of the spacing between the leveling plate and the chamber body by rotating the adjustment screw with respect to the mounting stud with the bushing rotating with the adjustment screw. The bushing is then fixed to the leveling plate. The method further comprises making fine adjustment of the spacing between the leveling plate and the chamber body by rotating the adjustment screw with respect to the mounting stud to move the adjustment screw in a first direction with respect to the mounting stud at a first rate and with respect to the bushing which is fixed to the leveling plate to move the bushing and the leveling plate in a second direction opposite from the first direction with respect to the adjustment screw at a second rate which is different from the first rate.

In accordance with another embodiment of the invention, a device for adjusting a spacing between a chamber body and a leveling plate comprises a mounting stud configured to be mounted to the chamber body. The mounting stud includes a stud threaded surface. A bushing is capable of being fixed to the leveling plate, and includes a bushing threaded surface. An adjustment screw has a first threaded surface threadingly engaged with the stud threaded surface of the mounting stud, and a second threaded surface threadingly engaged with the bushing threaded surface of the bushing. The threaded surfaces are configured, when the bushing is fixed to the leveling plate and the adjustment screw is turned, to cause the adjustment screw to move in a first direction with respect to the mounting stud at a first rate and the bushing to move in a second direction opposite from the first direction with respect to the adjustment screw at a second rate which is different from the first rate.

DETAILED DESCRIPTION OF THE INVENTION

Figure 1:
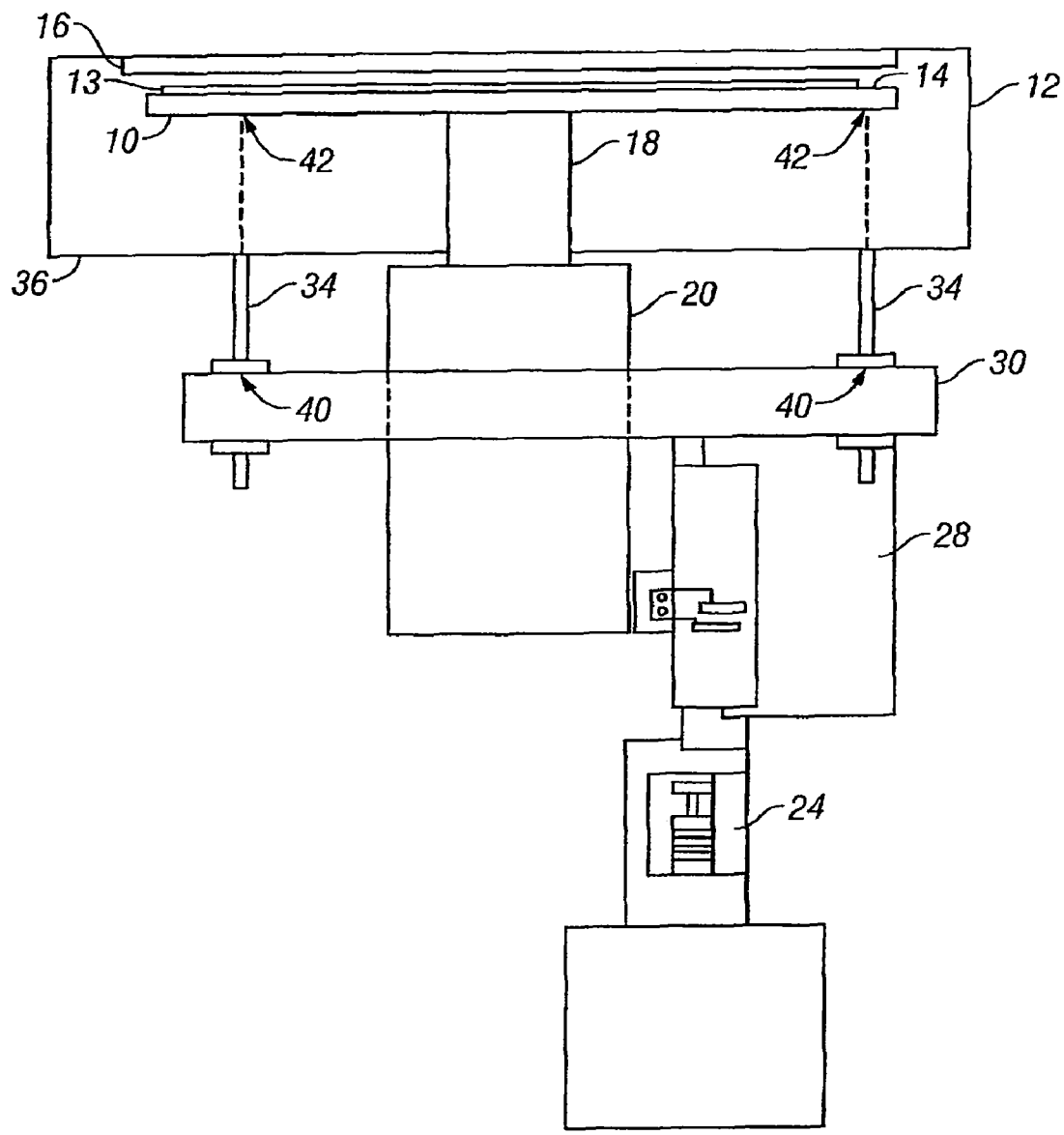
FIG. 1 is a simplified front elevational view of a substrate support showing a height adjustment mechanism according to an embodiment of the present invention.

As shown in FIG. 1, a substrate holder or support 10 is disposed in a processing chamber 12 for processing a substrate 13 to be placed on the substrate support surface 14. A gas distribution member 16, which is typically a faceplate having a plurality of apertures for introducing gases, is disposed generally opposite from the substrate support surface 14. The substrate holder 10 includes a shaft 18 which is supported on a support structure or hub 20 and is slidable with respect to the hub 20 to adjust the spacing between the substrate holder surface 14 and the faceplate 16. The hub 20 is disposed outside of the chamber 12. The shaft 18 is movable vertically by an actuator 24. The tilt of the substrate holder 10 can be defined by the tilt of the hub 20 due to the connection therebetween. The hub 20 is connected to a bracket 28, which is mounted to a leveling member or leveling plate 30. Adjustment of the tilt of the substrate holder 10 is made by adjusting the tilt of the leveling plate 30.

The leveling plate 30 is disposed generally parallel to the substrate support surface 14. At least two adjustment members 34 and one connecting member (e.g., a spherical bearing) are coupled between the leveling plate 30 and a reference surface 36. In the embodiment shown, the reference surface 36 is the bottom surface 36 of the chamber 12, but it may be some other surface that is fixed with respect to the faceplate 16. The reference surface 36 may be generally parallel to the faceplate 16. The adjustment members 34 are connected to the leveling plate 30 at a plurality of adjustment locations 40 distributed over the leveling plate 30. The adjustment members 34 are independently adjustable to change the spacings between the leveling plate 30 and the reference surface 36 at the adjustment locations 40. This in turn alters the spacings between the substrate support surface 14 and the faceplate 16 at a plurality of corresponding adjustment locations 42, thereby adjusting the tilt of the substrate support surface 14 with respect to the faceplate 16. In the embodiment of FIG. 1, the corresponding adjustment locations 42 of the substrate support surface 14 are generally aligned with the adjustment locations 40 of the leveling plate 30, since the leveling plate 30 is generally parallel to the substrate support surface 14. In specific embodiments, the corresponding adjustment locations 42 are uniformly distributed around the substrate support surface 14 with respect to the center of the support surface 14.

Figure 2:
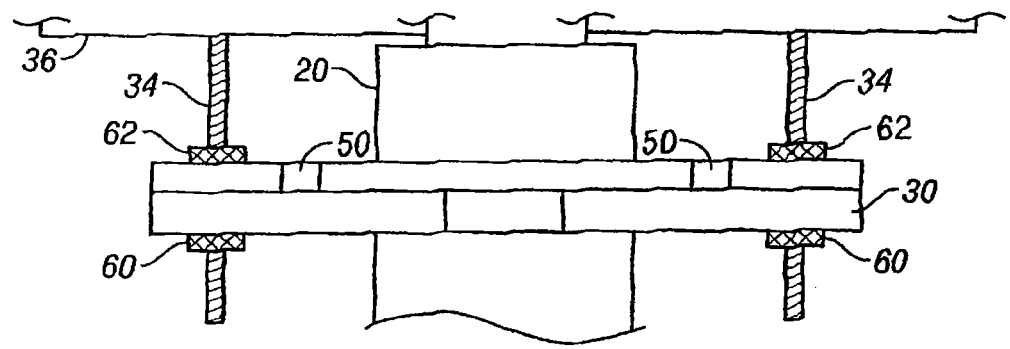
FIG. 2 is a side elevational view of a portion of the height adjustment mechanism of FIG. 1 showing slots for a micrometer.
Figure 3:
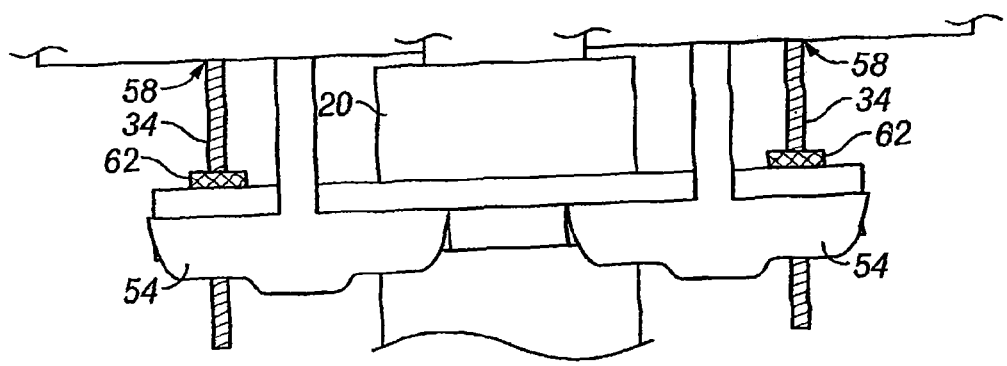
FIG. 3 is a side elevational view of a portion of the height adjustment mechanism of FIG. 1 showing the use of a micrometer for measuring height adjustments.

As more clearly seen in FIG. 2, the leveling plate 30 includes a plurality of measurement locations 50 for mounting measurement devices to measure the spacings between the leveling plate 30 and the reference surface 36. As illustrated in FIGS. 2 and 3, the measurement locations 50 include slots for mounting measurement devices 54 which may be micrometers. The micrometers 54 may be temporarily mounted at the measurement locations 50 when the leveling plate 30 is adjusted, and be removed after the adjustments are made. Typically, each measurement location 50 has a corresponding adjustment location 40, and each measurement location 50 is disposed in close proximity or adjacent to the corresponding adjustment location 40. For instance, the distance between each measurement location 50 and the corresponding adjustment location 40 is substantially less than the diameter of the substrate 13 (e.g., less than about 10% of the diameter of the substrate). In alternate embodiments, the numbers and proximity of the measurement locations 50 and adjustment locations 40 may vary. Different measurement techniques may be used.

The adjustment members 34 each include adjustment screws threadingly coupled to the leveling plate 30 and having ends 58 that bear against the reference surface 36 of the processing chamber 12. A knurled lock nut 60 is threadingly coupled to each adjustment screw 34 and bears against the bottom surface of the leveling plate 30. Another knurled lock nut 62 may also be provided to be threadingly coupled to the adjustment screw 34 and to bear against the top surface of the leveling plate 30. The knurled lock nuts preferably provide sufficiently fine adjustments to achieve the desired accuracy of tilt adjustment of the leveling plate 30 and hence the substrate support surface 14 (e.g., adjustments on the order of about 4 mil). An Allen wrench or the like may be used to turn the knurled lock nuts for adjustment. Of course, other suitable adjustment mechanisms may be used in alternate embodiments.

Experiments have demonstrated that the deposition rate of the layer on a substrate 13 can be correlated to the spacing between the substrate 13 and the faceplate 16, and hence the uniformity of the thickness of the layer formed on the substrate 13 can be adjusted by changing the tilt of the substrate support surface 14 on which the substrate 13 rests. Experimental results for two sets of tests are shown in FIGS. 4 and 5.

Figure 4:
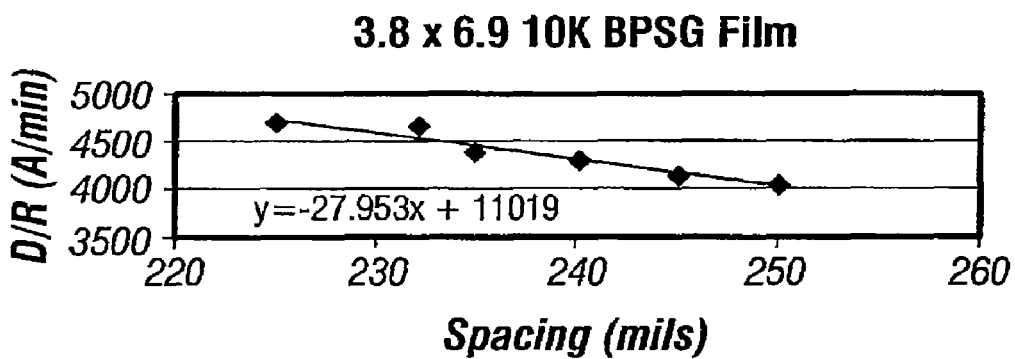
FIG. 4 shows a plot of the deposition rate in thickness per time versus the spacing between the substrate and the faceplate for one semiconductor process.

In FIG. 4, BPSG films were formed on substrates while varying the spacing between the substrate and the faceplate. The films were deposited using He, TEOS, TEB, TEPO as process gases at a temperature of about 550° C. and a pressure of about 200 Torr. FIG. 4 plots the deposition rate in thickness per time (Å/min) versus the spacing (mils). As the spacing increases, the deposition rate decreases by about 27.953 Å/min, which is the slope of the line that is used to compute a correlation factor for the particular process.

Figure 5:
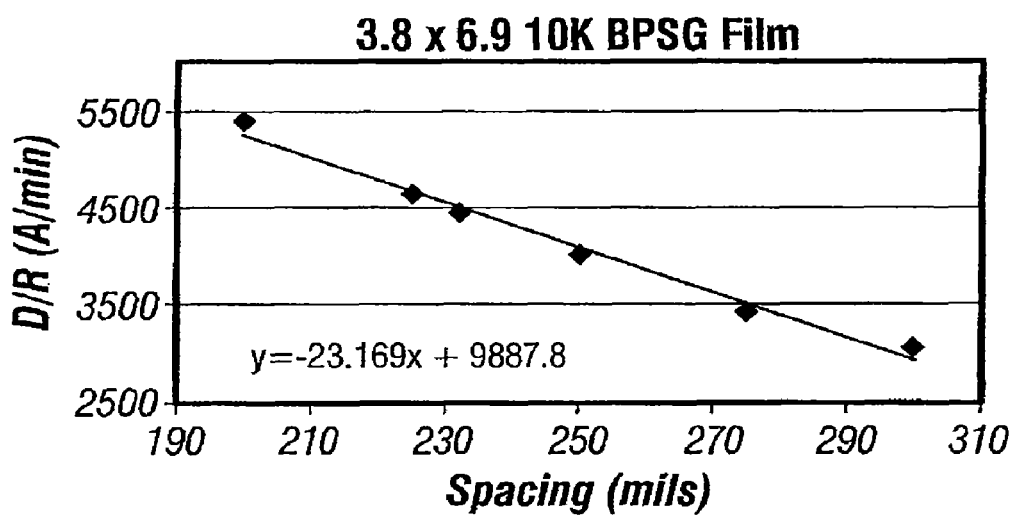
FIG. 5 shows a plot of the deposition rate in thickness per time versus the spacing between the substrate and the faceplate for another semiconductor process.

In FIG. 5, BPSG films were formed on substrates while varying the spacing between the substrate and the faceplate. The films were deposited using He, TEOS, TEB, TEPO as process gases at a temperature of about 550° C. and a pressure of about 200 Torr. As the spacing increases, the deposition rate decreases by about 23.169 Å/min, which is the slope of the line that is used to computer a correlation factor for the particular process. The relatively small difference in the results obtained for FIG. 4 and FIG. 5 may be attributed to the variability of the leveling mechanism, liquid flow variations, fab temperatures, and the like.

A three point counter-tilt procedure will now be described for adjusting the tilt of the substrate support surface to improve uniformity based on the correlation between deposition rate and spacing between the substrate and the faceplate that has been established for the particular type of process involved. As shown in the flow diagram 100 of FIG. 6, a layer is formed on the substrate after positioning the substrate support at a desired spacing from the faceplate (step 102). The thickness of the layer is measured in step 104, which may be done in situ. FIG. 7 shows an example of a thickness map 90 having 49 points to generate a thickness profile of the layer on the substrate. Three points 92, 94, 96 on the substrate correspond in location to the three measurement locations 50 on the leveling plate 30 for making spacing measurements using the micrometers 54 as illustrated in FIG. 3. The three points 92, 94, 96 are typically close to the edge of the substrate, and angularly spaced generally uniformly with respect to the center of the substrate. For example, the three points 92, 94, 96 are spaced about 120° apart with respect to the center of the substrate, and are each spaced from the edge of the substrate by a distance that is less than about 10% of the radius of the substrate.

Figure 6:
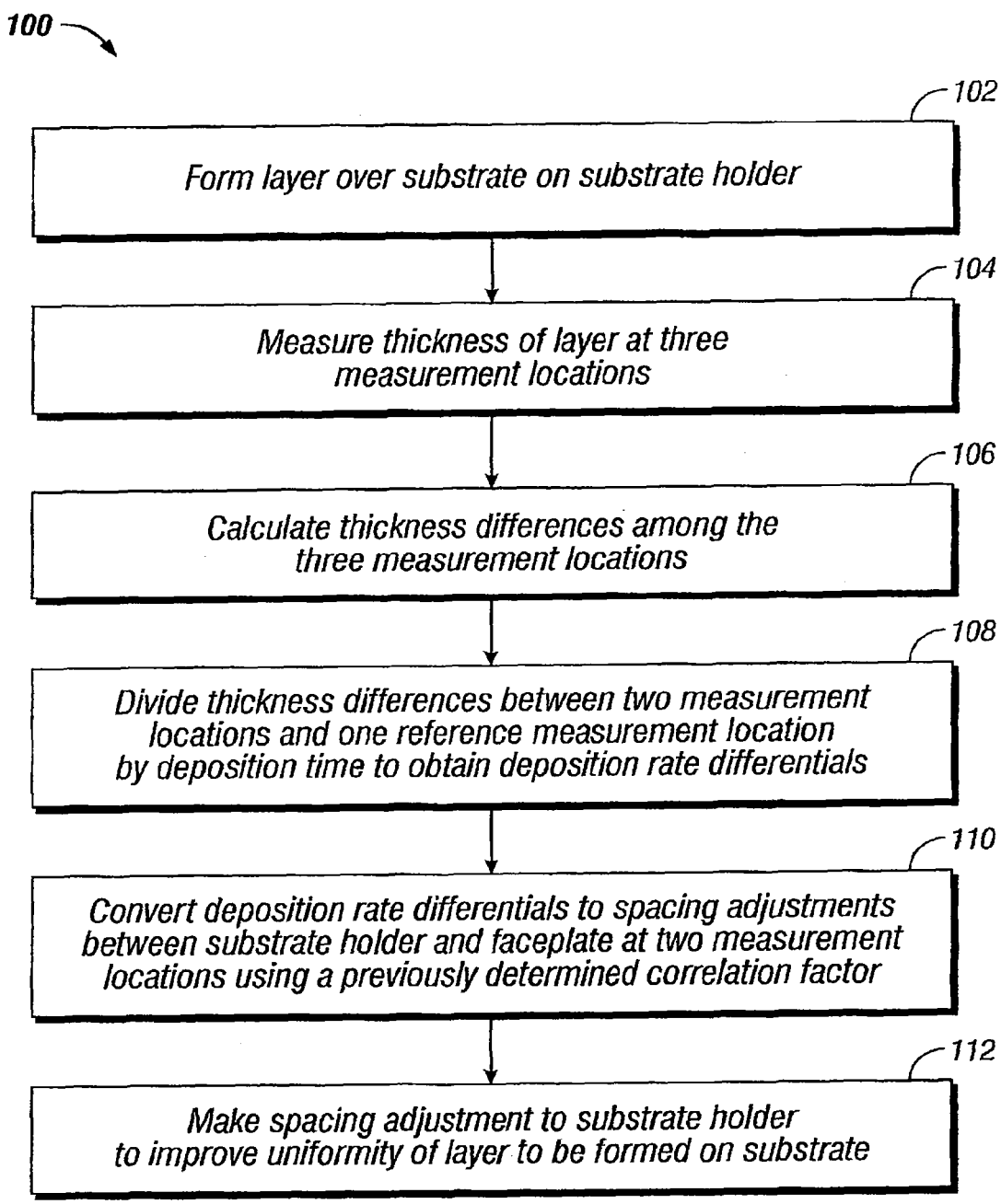
FIG. 6 is a flow diagram of the substrate support leveling method according to an embodiment of the present invention.
Figure 7:
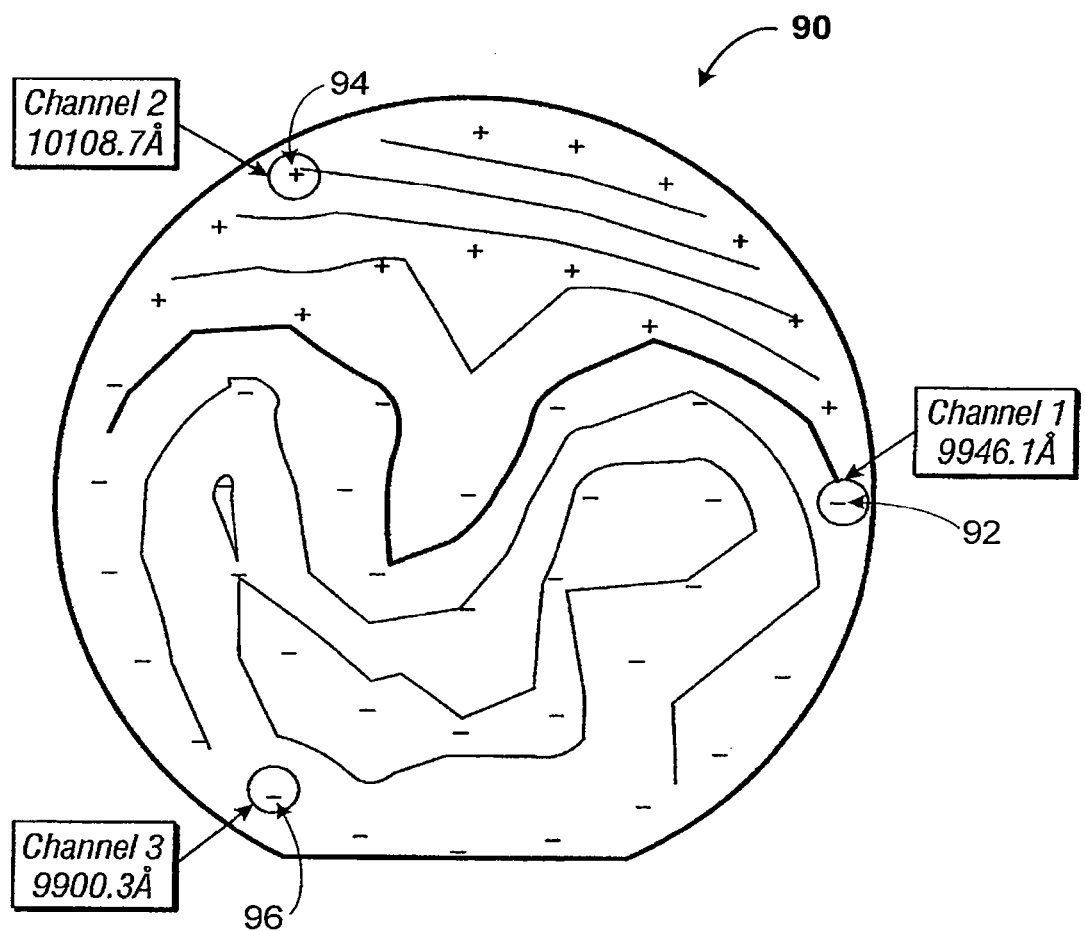
FIG. 7 is a thickness map of a layer formed on the substrate in one example.

Referring to FIG. 6, the next step 106 is to calculate the thickness differences among the three points. For instance, the point 92 is selected as a reference location and the thickness differences are calculated between the reference point 92 and the other points 94, 96 at the remaining locations. In step 108, the thickness differences (between the points 94 and 92 and between the points 96 and 92) are divided by the deposition time to obtain the deposition rate differentials between the reference point 92 and the remaining points 94, 96. A previously determined correlation factor is then used to convert the deposition rate differentials into spacing adjustments at the remaining points 94, 96 to improve the uniformity (step 110). The spacing adjustment is positive to increase the spacing between the substrate support at the remaining point and the faceplate if the thickness is greater at that remaining point than at the reference point 92. Conversely, the spacing adjustment is negative to decrease the spacing between the substrate support at the remaining point and the faceplate if the thickness is smaller at that remaining point than at the reference point 92. In step 112, the spacing adjustments are made, and the substrate support is calibrated for forming layers of improved uniformity for the particular process selected.

The correlation factor is proportional to the slope of a plot of deposition rate versus spacing such as those shown in FIGS. 4 and 5. That is, the correlation factor is proportional to a ratio of change in spacing divided by deposition thickness rate of the layer. Typically, the correlation factor will not be equal to the slope, but will need to be modified to account for the difference between the three point counter-tilt procedure and the spacing adjustments used to obtain the slope of the plot. To obtain the plot, the substrate is moved up or down without tilting. In the three point counter-tilt procedure, however, the spacing at one of the remaining points is adjusted with respect to the reference point to tilt the substrate. Thus, the correlation factor will equal to the slope of the plot multiplied by a correction factor or constant, which may be determined empirically by conducting a number of experiments to determine the correction factor to achieve film thickness uniformity.

Various experiments were conducted to confirm the repeatability of the three point counter-tilt procedure to achieve improvement in thickness uniformity in the layer formed on the substrate for particular semiconductor processes.

Figure 8:
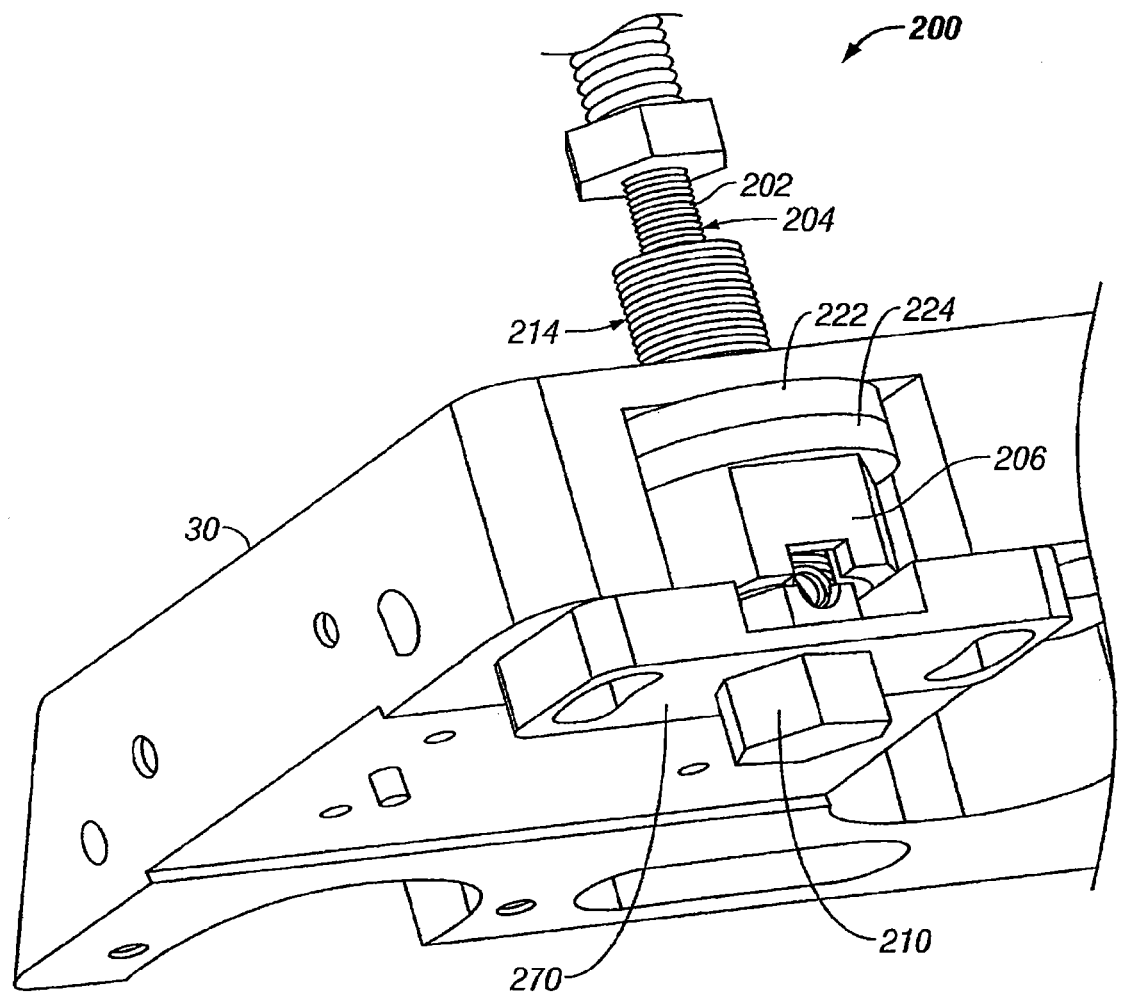
FIG. 8 is a perspective view of a height adjustment device mounted to a leveling plate according to an embodiment of the present invention.
Figure 9:
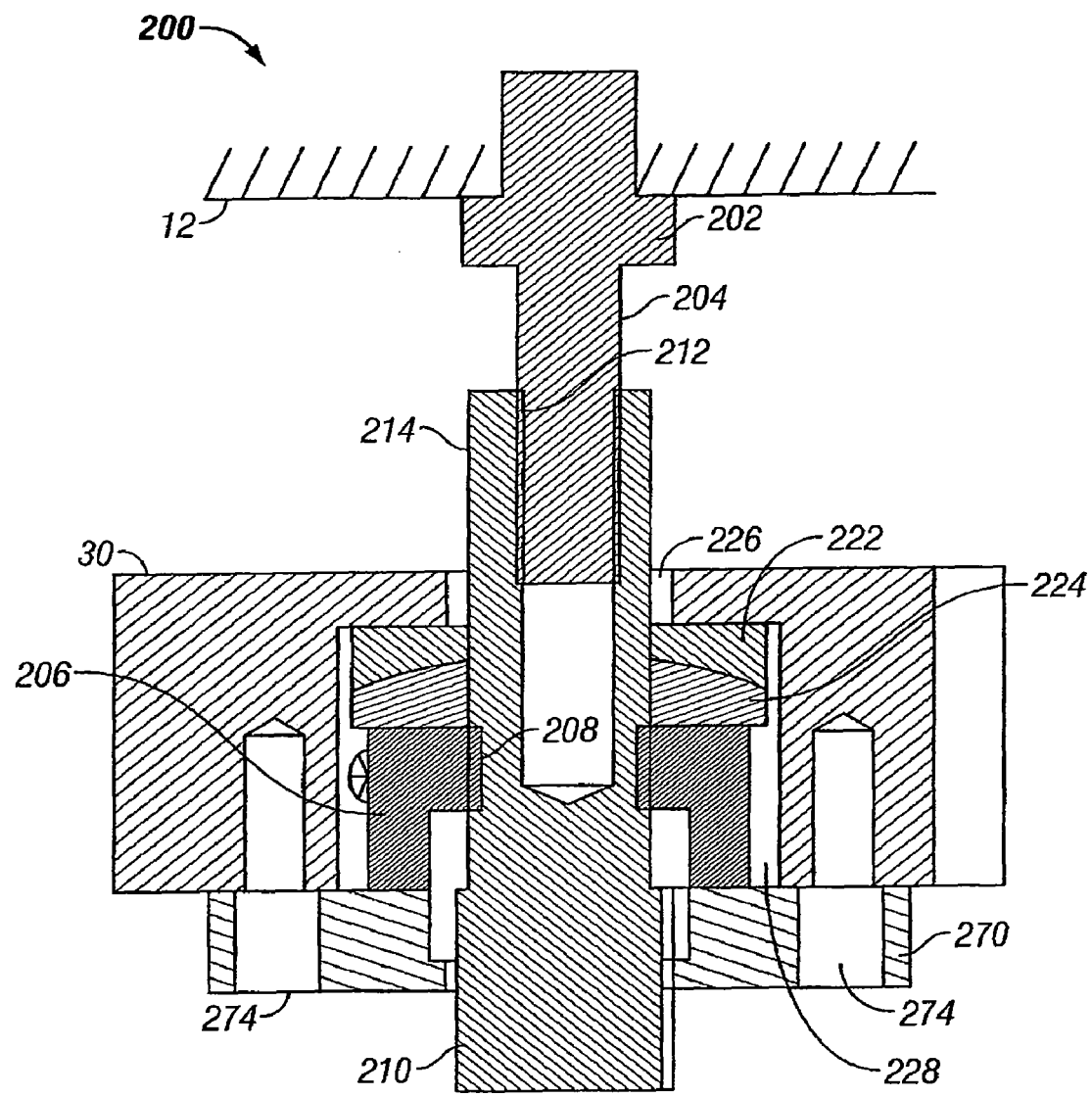
FIG. 9 is a cross-sectional view of the height adjustment device of FIG. 8.

FIGS. 8 and 9 show a height adjustment device 200 for adjustment the spacing between the chamber body 12 and the leveling plate 30 at a particular location. The height adjustment device 200 provides coarse and fine adjustment for high resolution leveling of the substrate support. The height adjustment device 200 may be used in any of the at least two height adjustment locations according to the leveling scheme of the present invention. In a specific embodiment, two height adjustment devices 200 are used at two locations, and a relatively simple attachment with a connecting member such as a spherical coupling is provided at a third location.

Figure 10:
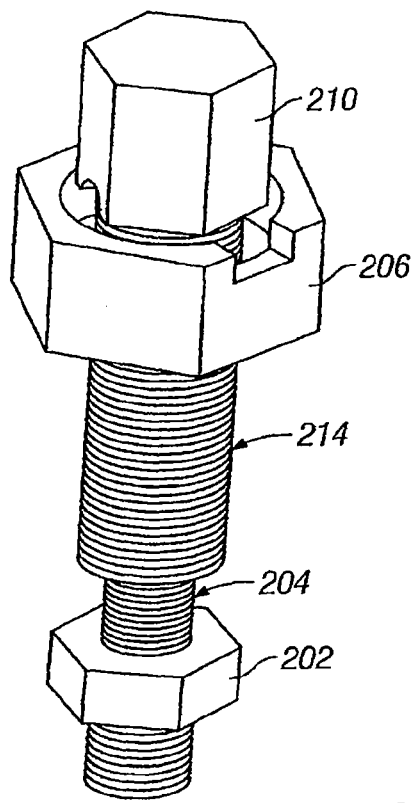
FIG. 10 is a perspective view of an adjustment screw, a bushing, and a mounting stud of the height adjustment device of FIG. 8.
Figure 11:
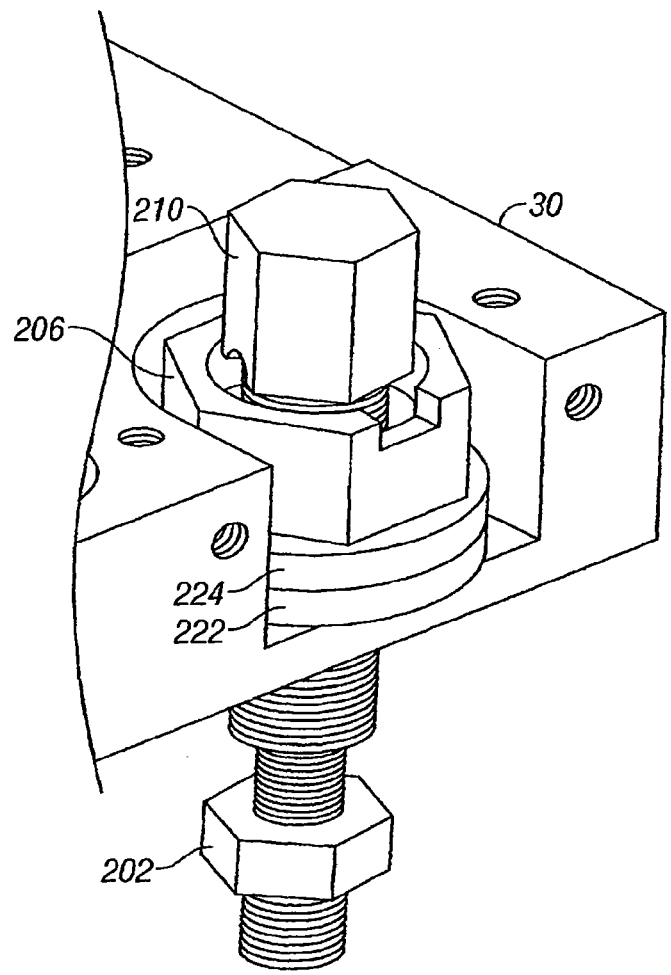
FIG. 11 is a perspective view of the height adjustment device of FIG. 8 mounted to the leveling plate with spherical washers.
Figure 12:
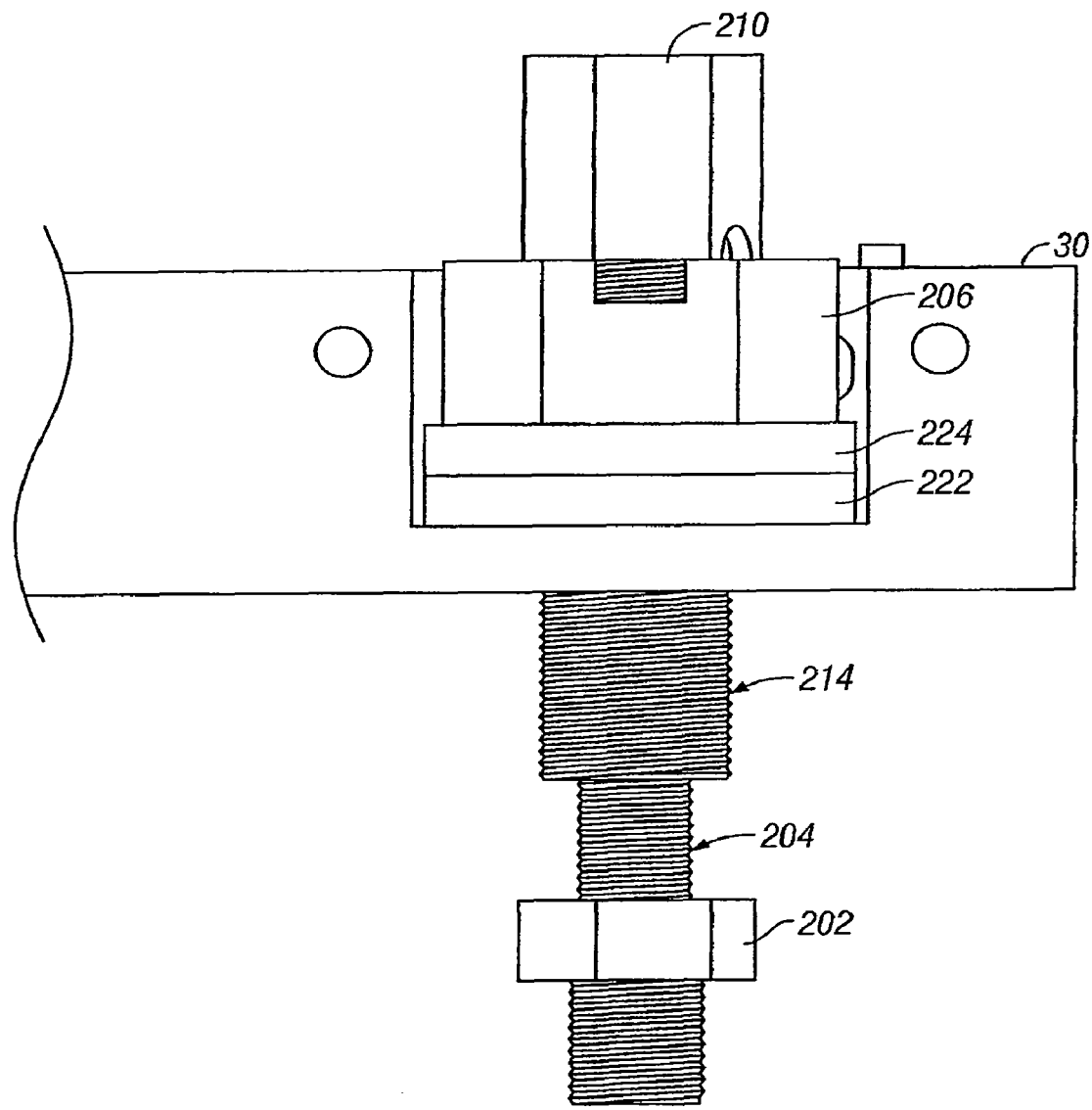
FIG. 12 is an elevational view of the height adjustment device as shown in FIG. 11.

The height adjustment device 200 includes a mounting stud 202 mounted to the chamber body 12, for instance, via a threaded connection with the chamber body 12. The mounting stud 202 has a stud threaded surface 204. A bushing 206 which is capable of being fixed to the leveling plate 30 includes a bushing threaded surface 208. An adjustment screw 210 has a first threaded surface 212 threadingly engaged with the stud threaded surface 204 of the mounting stud 202, and a second threaded surface 214 threadingly engaged with the bushing threaded surface 208 of the bushing 206. In the embodiment shown in FIGS. 8-10, the stud threaded surface 204 is an external surface of the mounting stud 202, the bushing threaded surface 208 is an internal surface of the bushing 206, the first threaded surface 212 is an internal surface in a cavity of the adjustment screw 210, and the second threaded surface 214 is an external surface of the adjustment screw 210. A pair of spherical washers 222, 224 are disposed between the bushing 206 and the leveling plate 30, as best seen in FIGS. 9, 11, and 12.

As assembled, the adjustment screw 210 extends through an opening 226 of the leveling plate 30, which includes an enlarged cavity 228 for receiving the bushing 206 and washers 222, 224, as best seen in FIG. 9. A locking cap 270 presses the washers 222, 224 and the bushing 206 against the leveling plate 30, and the adjustment screw 210 is threadingly engaged with the bushing 206 and movable with respect to the bushing 206 and the leveling plate 30. For coarse adjustment, the adjustment screw 210 is rotated with respect to the mounting stud 202, and the bushing 206 moves with the screw 210. The rate of movement is determined by the threads or revolutions per inch of the threads at the connection between the first threaded surface 212 of the adjustment screw 210 and the stud threaded surface 204 of the mounting stud 202. In one example, the threaded connection has 24 threads per inch, and the rate of movement is $\frac{1}{24}$ inch per revolution of the adjustment screw 210 with respect to the mounting stud 202.

Figure 13:
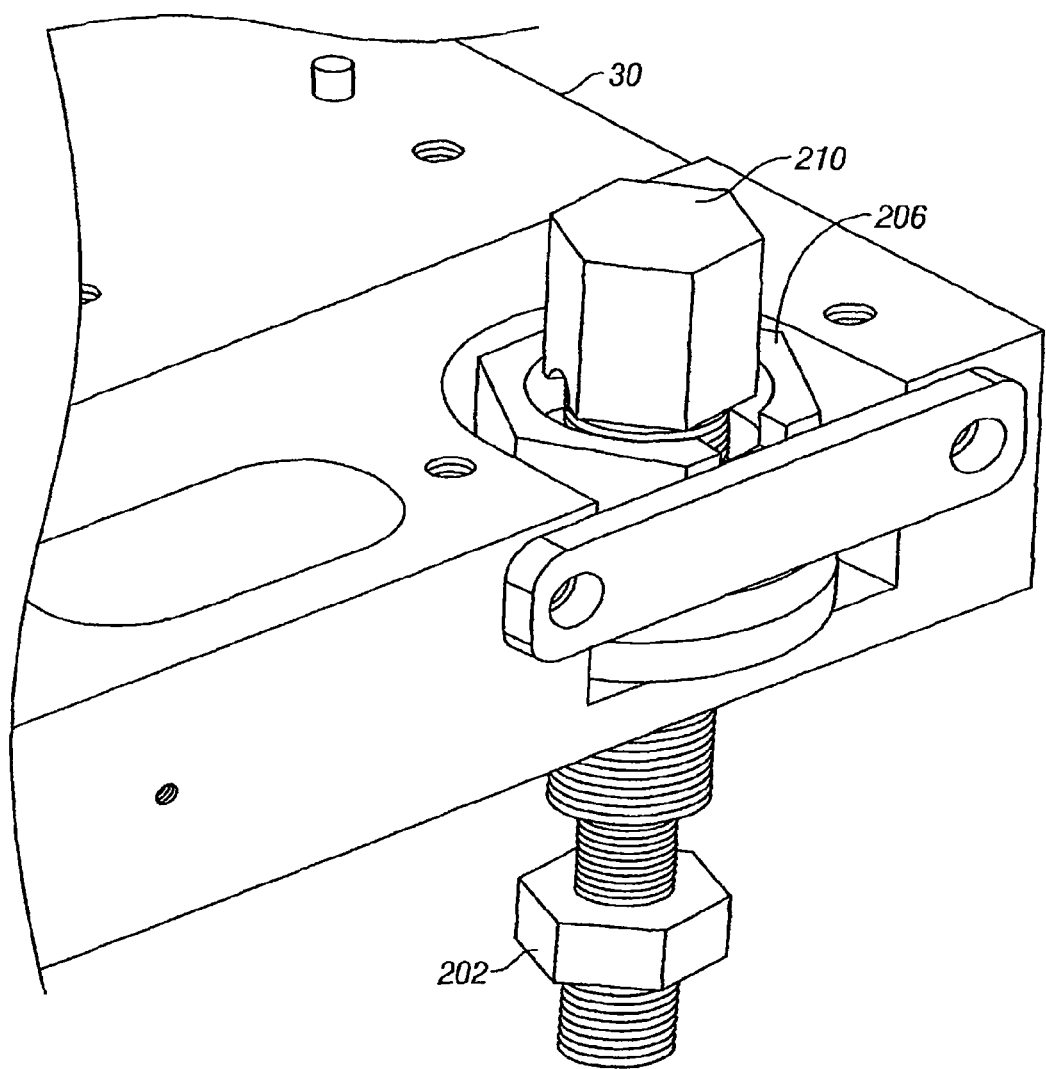
FIG. 13 is a perspective view of the height adjustment device of FIG. 8 showing a locking plate for locking the bushing to the leveling plate.

After the coarse adjustment brings the leveling plate 30 to within a desirable range of spacing from the chamber body 12, fine adjustment is made. To prepare the adjustment device for fine adjustment, the bushing 206 is locked to the leveling plate 30. Any suitable locking mechanism may be used. In FIG. 13, a retaining member such as a retaining plate or bar 230 is attached to the side of the leveling plate 30 to lock in the bushing 206 to the leveling plate 30. The retaining member 230 bears against a planar surface of the bushing 206 so as to prevent it from rotating relative to the leveling plate 30, and to prevent side-to-side movement of the leveling plate 30 with respect to the adjustment screw 210. The retaining member 230 may be attached to the leveling plate 30 by fasteners such as screws.

With the adjustment screw 210 threadingly coupled to the mounting stud 202 and to the bushing 206 which is in turn mounted to the leveling plate 30 as shown in FIGS. 9 and 13, fine adjustment of the leveling plate 30 with respect to the chamber body 12 can be made (with the locking cap 270 or the like installed). When the adjustment screw 210 is rotated (e.g., in the clockwise direction), the adjustment screw 210 moves with respect to the mounting stud 202 in a first direction (e.g., up direction in FIG. 9) via the threaded connection between the first threaded surface 212 of the adjustment screw 210 and the stud threaded surface 204 of the mounting stud 202. At the same time, the bushing 206 and the leveling plate 30 moves with respect to the adjustment screw 210 in a second direction (e.g., down direction) which is opposite from the first direction via the threaded connection between the second threaded surface 214 of the adjustment screw 210 and the bushing threaded surface 208 of the bushing 206. The adjustment screw 210 moves with respect to the mounting stud 202 in the first direction at a first rate (e.g., 1/24 inch per revolution for a threaded connection of 24 threads per inch). The bushing 206 and leveling plate 30 move with respect to the adjustment screw 210 in the second direction at a second rate. In the example, the threaded connection between the adjustment screw 210 and the bushing 206 has 28 threads per inch so as to move at a second rate of 1/28 inch per revolution. The net rate of movement is the difference between the first rate and the second rate, i.e., 1/24-1/28 inch per revolution, which is 0.006 inch per revolution in the first direction (up direction). The movement in the opposite direction can be achieved by rotating the adjustment screw 210 in the opposite direction (e.g., counter-clockwise direction). This high resolution movement of the two threaded connections allows fine adjustment of the leveling plate 30 with respect to the chamber body 12. The spherical washers 222, 224 take up any misalignment of the leveling plate 30 with respect to the chamber body 12.

Figure 14:
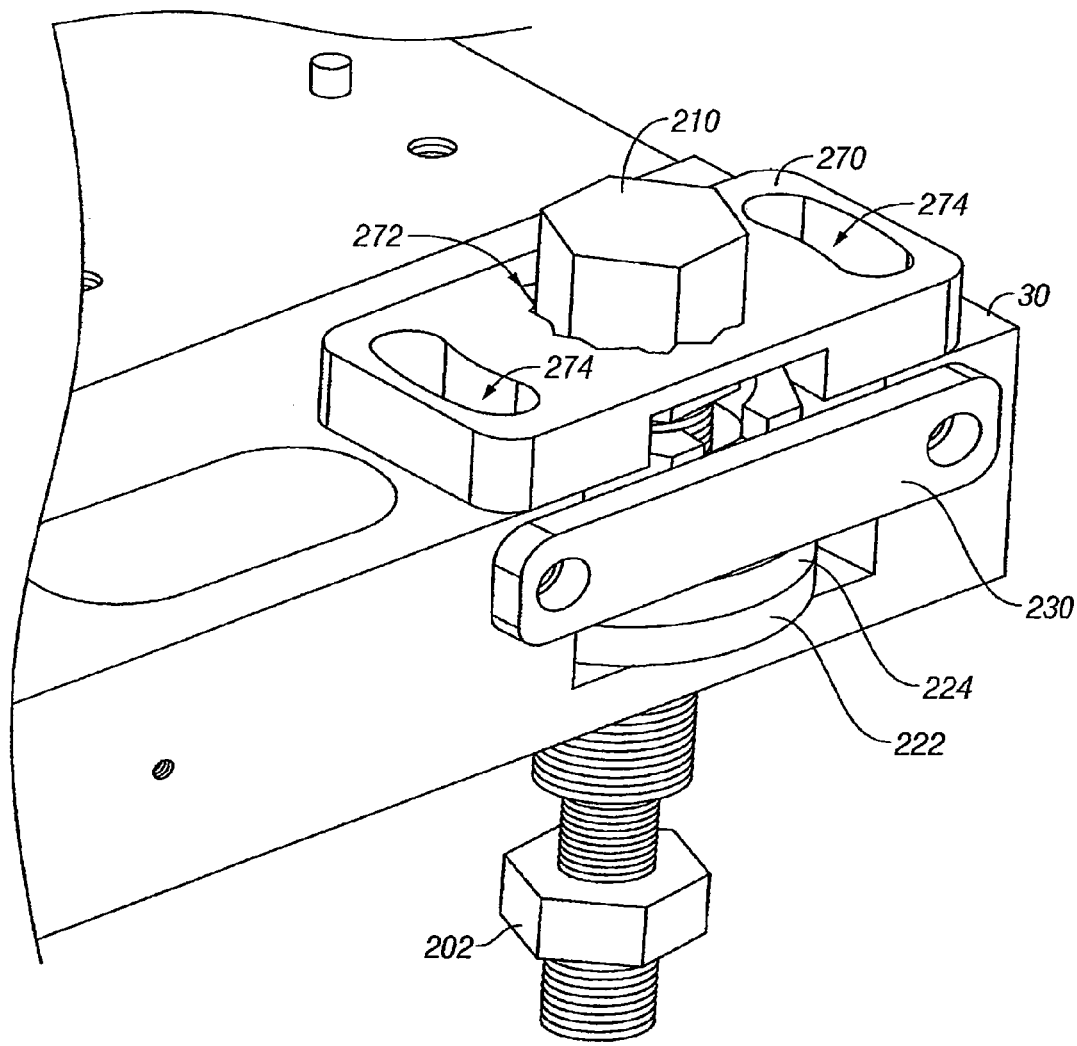
FIG. 14 is a perspective view of the height adjustment device of FIG. 8 showing a locking cap for locking the adjustment screw to the leveling plate.
Figure 15:
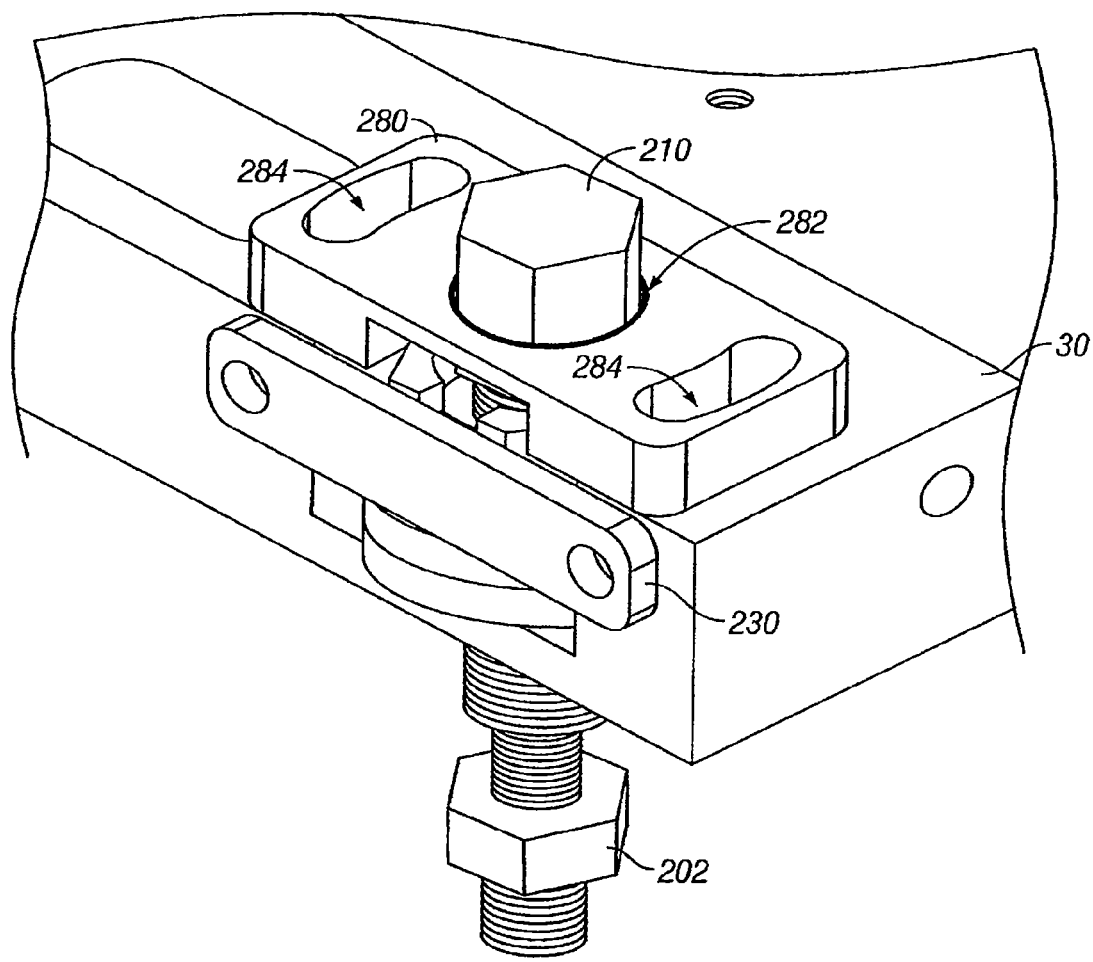
FIG. 15 is a perspective view of the height adjustment device of FIG. 8 showing another embodiment of the locking cap with a locking nut for locking the adjustment screw to the leveling plate.
Figure 16:
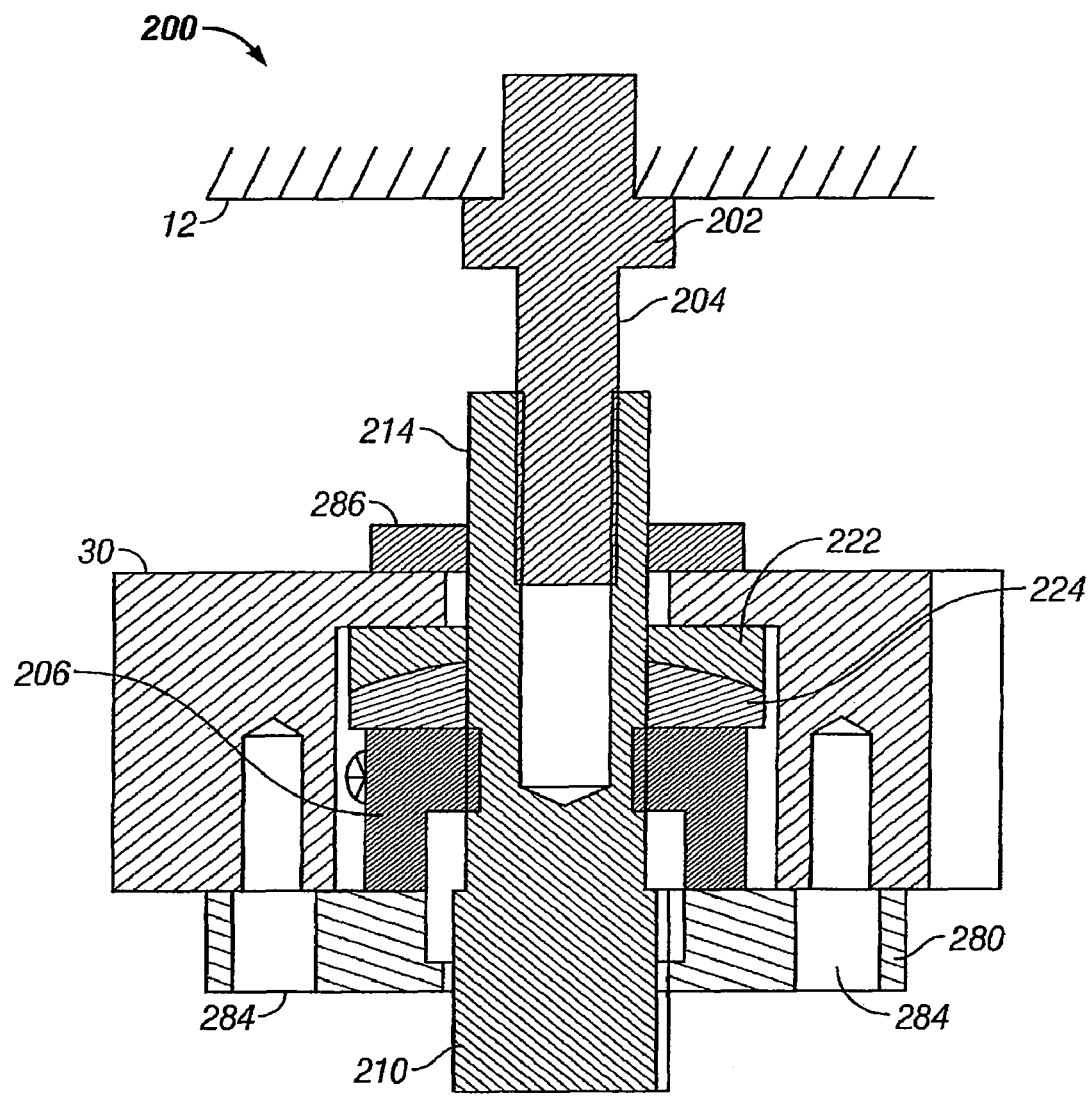
FIG. 16 is an elevational view showing the use of the locking cap and locking nut in the height adjustment device of FIG. 15.

After the desired fine adjustment is made, the height adjustment device 200 is locked in place. A variety of suitable locking mechanisms may be used. FIGS. 8, 9, and 14 show the use of the locking cap 270 coupled with the adjustment screw 210 and the leveling plate 30. The locking cap 270 includes a socket opening 272 which engages or fits tightly with the exterior surface of the adjustment screw 210. The locking cap 270 further includes a pair of slots 274 through which fasteners can be used to fasten the locking cap 270 to the leveling plate 30. Such a locking mechanism locks the adjustment screw 210 to the leveling plate 30 and prevents rotation of the adjustment screw 210 relative to the leveling plate 30. In another embodiment as shown in FIGS. 15 and 16, the locking cap 280 has an opening 282 which does not fit tightly around the adjustment screw 210 (e.g., a circular opening), and a pair of slots 284. The locking cap 280 is disposed on one side of the bushing 206 and leveling plate 30, and a locking nut 286 is disposed on an opposite side of the bushing 206 and leveling plate 30. The locking cap 280 bears the bushing 206 against the leveling plate 30 from one side and the locking nut 286 is threadingly coupled with the adjustment screw 210 to threadingly bear against the leveling plate 30 from the opposite side to lock the bushing 206 and the adjustment screw 210 against the leveling plate 30 to prevent the adjustment screw 210 from rotating.

The above-described arrangements of apparatus and methods are merely illustrative of applications of the principles of this invention and many other embodiments and modifications may be made without departing from the spirit and scope of the invention as defined in the claims. For instance, the threaded surfaces on the adjustment screw and mounting stud may be configured differently on different internal and external surfaces. The scope of the invention should, therefore, be determined not with reference to the above description, but instead should be determined with reference to the appended claims along with their full scope of equivalents.

What is claimed is:

1. A method for adjusting a spacing between a leveling plate and a chamber body, the method comprising:
    making a coarse adjustment of the spacing by rotating a first threaded surface of an adjustment screw with respect to a stud threaded surface of a mounting stud to move the adjustment screw in a first direction with respect to the mounting stud; and
    making a fine adjustment of the spacing by rotating the first threaded surface of the adjustment screw with respect to the stud threaded surface of the mounting stud to move the adjustment screw in the first direction with respect to the mounting stud, and rotating a second threaded surface of the adjustment screw with respect to a bushing threaded surface of a bushing to move the adjustment screw with respect to the bushing in a second direction opposite the first direction, wherein the bushing rotates with the adjustment screw during the coarse adjustment and the bushing is fixed to the leveling plate during the fine adjustment, and a rate of the coarse adjustment is determined by a first connection between the first threaded surface and the stud threaded surface, and a rate of the fine adjustment is determined by the first connection between the first threaded surface and the stud threaded surface and a second connection between the second threaded surface and the bushing threaded surface.

2. A method for adjusting a spacing between a leveling plate and a chamber body, the method comprising:
    performing a coarse adjustment of the spacing by rotating an adjustment screw, wherein a first threaded surface of the adjustment screw is threadingly engaged with a stud threaded surface of a mounting stud and rotating the adjustment screw moves the adjustment screw in a first direction with respect to the mounting stud, and a rate of change of the spacing during the coarse adjustment is determined by a first connection between the first threaded surface and the stud threaded surface; and
    performing a fine adjustment of the spacing by rotating the adjustment screw, wherein the first threaded surface is threadingly engaged with the stud threaded surface and a second threaded surface of the adjustment screw is threadingly engaged with a bushing threaded surface of a bushing, and rotating the adjustment screw moves the adjustment screw in the first direction with respect to the mounting stud and moves the bushing and the leveling plate in a second direction opposite the first direction with respect to the adjustment screw, wherein the bushing rotates with the adjustment screw during the coarse adjustment and the bushing is fixed to the leveling plate during the fine adjustment, and a rate of change of the spacing during the fine adjustment is determined by the first connection between the first threaded surface and the stud threaded surface and a second connection between the second threaded surface and the bushing threaded surface.

3. The method of claim 2 wherein the rate of change of the spacing during the coarse adjustment is greater than the rate of change of the spacing during the fine adjustment.

4. The method of claim 2 further comprising locking the adjustment screw to the leveling plate to prevent rotation of the adjustment screw relative to the leveling plate after making the fine adjustment of the spacing.

5. A method for adjusting a spacing of a leveling plate from a chamber body, the method comprising:

attaching a mounting stud to the chamber body, the mounting stud including a stud threaded surface;

providing an adjustment screw having a first threaded surface threadingly engaged with the stud threaded surface of the mounting stud;

providing a bushing having a bushing threaded surface threadingly engaged with a second threaded surface of the adjustment screw;

movably coupling the bushing to the leveling plate;

making coarse adjustment of the spacing between the leveling plate and the chamber body by rotating the adjustment screw with respect to the mounting stud to move the adjustment screw in a first direction with respect to the mounting stud at a first rate and with the bushing rotating with the adjustment screw;

fixing the bushing to the leveling plate; and making fine adjustment of the spacing between the leveling plate and the chamber body by rotating the adjustment screw with respect to the mounting stud to move the adjustment screw in the first direction with respect to the mounting stud at the first rate, and rotating the adjustment screw with respect to the bushing which is fixed to the leveling plate to move the bushing and the leveling plate in a second direction opposite from the first direction with respect to the adjustment screw at a second rate which is different from the first rate, wherein the first rate is determined by a first threaded connection between the adjustment screw and the mounting stud, and the second rate is determined by the first threaded connection between the adjustment screw and the mounting stud and a second threaded connection between the adjustment screw and the bushing.

6. The method of claim 5 wherein the first threaded surface of the adjustment screw is an internal surface in a cavity of the adjustment screw which is threadingly engaged with the stud threaded surface which is an external surface of the mounting stud.

7. The method of claim 5 wherein the second threaded surface of the adjustment screw is an external surface which is threadingly engaged with the bushing threaded surface which is an internal surface of the bushing.

8. The method of claim 5 wherein the first threaded surface of the adjustment screw and the stud threaded surface of the mounting stud are configured to move with respect to one another at the first rate of a given inch per revolution of the adjustment screw, wherein the second threaded surface of the adjustment screw and the bushing threaded surface of the bushing are configured to move with respect to one another at the second rate of a given inch per revolution of the adjustment screw, and wherein the first rate is greater than the second rate.

9. The method of claim 5 wherein the leveling plate includes an enlarged cavity for receiving the bushing.

10. The method of claim 5 wherein movably coupling the bushing to the leveling plate comprises placing spherical washers between the bushing and the leveling plate.

11. The method of claim 5 wherein the mounting stud is attached to the chamber body via a threaded connection.

12. The method of claim 5 wherein fixing the bushing to the leveling plate comprises attaching a retaining member to the leveling plate to bear the bushing against the leveling plate to prevent rotation of the bushing relative to the leveling plate.

13. The method of claim 12 wherein the retaining member is attached to a side of the leveling plate.

14. The method of claim 5 further comprising locking the adjustment screw to the leveling plate to prevent rotation of the adjustment screw relative to the leveling plate after making the fine adjustment of the spacing between the leveling plate and the chamber body.

15. The method of claim 14 wherein locking the adjustment screw to the leveling plate comprises attaching a locking cap to the leveling plate and bearing the bushing against the leveling plate from one side of the leveling plate, and threadingly coupling a locking nut with the adjustment screw to threadingly bear against the leveling plate from an opposite side of the leveling plate to lock the bushing and the adjustment screw against the leveling plate.

* * * * *